United States Patent
Park et al.

(10) Patent No.: US 9,672,915 B2
(45) Date of Patent: Jun. 6, 2017

(54) STORAGE DEVICE USING POWER STATE INFORMATION AND OPERATING METHOD THEREOF

(71) Applicant: Samsung Electronics Co., Ltd., Suwon-si (KR)

(72) Inventors: Hyunchul Park, Ansan-si (KR); Se-Wook Na, Suwon-si (KR); Young-Jae Jung, Seoul (KR); Durina Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 23 days.

(21) Appl. No.: 14/995,627

(22) Filed: Jan. 14, 2016

(65) Prior Publication Data

US 2016/0259577 A1    Sep. 8, 2016

(30) Foreign Application Priority Data

Mar. 5, 2015  (KR) .................. 10-2015-0031071

(51) Int. Cl.
| | |
|---|---|
| G06F 12/00 | (2006.01) |
| G11C 16/04 | (2006.01) |
| G11C 16/30 | (2006.01) |
| G11C 5/14 | (2006.01) |
| G11C 29/02 | (2006.01) |
| G06F 13/16 | (2006.01) |
| G06F 11/14 | (2006.01) |
| G11C 29/04 | (2006.01) |

(52) U.S. Cl.
CPC ...... *G11C 16/0466* (2013.01); *G06F 13/1668* (2013.01); *G11C 5/147* (2013.01); *G11C 16/30* (2013.01); *G11C 29/021* (2013.01); *G06F 11/1456* (2013.01); *G11C 2029/0409* (2013.01)

(58) Field of Classification Search
None
See application file for complete search history.

(56) References Cited

U.S. PATENT DOCUMENTS

| | | | |
|---|---|---|---|
| 7,269,755 B2 | 9/2007 | Moshayedi et al. | |
| 7,275,140 B2 | 9/2007 | Paley | |
| 7,679,133 B2 | 3/2010 | Son et al. | |
| 8,553,466 B2 * | 10/2013 | Han .................... | G11C 16/04 365/185.18 |
| 8,559,235 B2 | 10/2013 | Yoon et al. | |
| 8,612,791 B2 | 12/2013 | Wakrat et al. | |
| 8,654,587 B2 | 2/2014 | Yoon et al. | |
| 2010/0332741 A1 | 12/2010 | Cornwell et al. | |

(Continued)

FOREIGN PATENT DOCUMENTS

| | | |
|---|---|---|
| JP | H07160433 | 6/1995 |
| JP | H08190458 | 7/1996 |

(Continued)

*Primary Examiner* — Brian Peugh
(74) *Attorney, Agent, or Firm* — Onello & Mello LLP

(57) ABSTRACT

A storage device includes a nonvolatile memory device and a memory controller configured to control the nonvolatile memory device in response to a request from a host. The memory controller is configured to employ state information related to the confidence level of a power supply to determine a reliability level with respect to an access operation of the memory device and to perform a reliability guarantee operation corresponding to the determined reliability level.

20 Claims, 18 Drawing Sheets

(56) References Cited

U.S. PATENT DOCUMENTS

2011/0233648 A1  9/2011 Seol et al.
2011/0252205 A1* 10/2011 Rege .................. G06F 12/0868
                                                         711/154
2014/0247682 A1  9/2014 Kursula

FOREIGN PATENT DOCUMENTS

| JP | H11149332 | 6/1999 |
| JP | H11238191 | 8/1999 |
| JP | 2003100088 | 4/2003 |
| JP | 2003308256 | 10/2003 |
| JP | 2009110451 | 5/2009 |

* cited by examiner

FIG. 4

| Next PS<br>Current PS | Power On | Unpredictable | Sustainable | Off-Expected | Power Off |
|---|---|---|---|---|---|
| Power On | – | Immediately | X | X | SP0 |
| Unpredictable | X | No Instruction | Instruction from Host | Instruction from Host | SP0 |
| Sustainable | X | Instruction from Host | No Instruction | Instruction from Host | SP0 |
| Off-Expected | X | Write Requested | Instruction from Host | No Instruction | Time Elapse |

FIG. 6

| Operation / Power Status | Reliability Level | Data Backup | Meta Backup |
|---|---|---|---|
| Unpredictable | Best effort | Periodically or conditional | Periodically or conditional |
| Sustainable | Not guaranteed | Unperformed or long period | Unperformed or long period |
| Off-Expected | Confirmed | Unperformed | Unperformed |

STORAGE DEVICE USING POWER STATE INFORMATION AND OPERATING METHOD THEREOF

CROSS-REFERENCE TO RELATED APPLICATIONS

This U.S. non-provisional patent application claims priority under 35 U.S.C. §119 of Korean Patent Application No. 10-2015-0031071, filed on Mar. 5, 2015, the entire contents of which are hereby incorporated by reference.

BACKGROUND

Inventive concepts relate to a semiconductor memory, and more particularly, to a storage device with increased performance and reliability using power state information provided by a host, and an operating method thereof.

A semiconductor memory device may be embodied using semiconductor such as silicon Si, germanium Ge, gallium arsenide GaAs, indium phospide InP, etc. and may be classified as a volatile semiconductor memory device or a nonvolatile semiconductor memory device.

A volatile memory device loses its stored data when its power supply is interrupted. Examples of the volatile memory device include a static RAM (SRAM), a dynamic RAM (DRAM), a synchronous DRAM (SDRAM), etc. A nonvolatile memory device retains its stored data even when its power supply is interrupted. Examples of the nonvolatile memory device include a read only memory (ROM), a programmable ROM (PROM), an electrically programmable ROM (EPROM), an electrically erasable and programmable ROM (EEPROM), a flash memory, a phase change RAM (PRAM), a magnetic RAM (MRAM), a resistive RAM (RRAM), a ferroelectric RAM (FRAM), etc.

A storage device may be manufactured using a nonvolatile memory and may include a nonvolatile memory and a memory controller that accesses the nonvolatile memory and communicates with an external host device. The storage device may be mounted on, or included in, a variety of mobile devices such as a smart phone, a smart pad, etc. and may be embodied in the form of a product such as a removable card, an embedded card, or a SSD (solid state drive).

Mobile devices such as a smart phone, or a smart pad fitted with the storage device described above may employ a batter as a power supply. Thus, the storage device may perform an operation for maintaining reliability of data considering a SPO (sudden power off) of a host. The storage device can maintain reliability of data by a method of periodically backing up data. However, relatively many resources are consumed to maintain reliability of data using the backup method. That is, a lifespan of a nonvolatile memory device having a limited write count may be shortened and performance of the storage device may be degraded by a control operation for maintaining reliability.

SUMMARY

Example embodiments in accordance with principles of inventive concepts provide an operation method of a storage device including a nonvolatile memory device. The method of operating may include receiving power state information representing a state of a power supply being supplied from a host to the storage device, determining a power state of the storage device according to a change of the power state information, selecting at least one of a plurality of reliability levels with respect to the nonvolatile memory device according to the determined power state, and performing a reliability guarantee operation with respect to the nonvolatile memory device corresponding to the selected at least one reliability level. The power state comprises any one of unpredictable, sustainable, and off-expected with respect to the power supply.

Example embodiments in accordance with principles of inventive concepts also provide a storage device. The storage device may include a nonvolatile memory device, and a memory controller configured to control the nonvolatile memory device according to a request from a host. The memory controller receives state information with respect to a power supply being provided from the host to determine a reliability level with respect to an access operation of the nonvolatile memory device and performs a reliability guarantee operation corresponding to the determined reliability level. The state information with respect to a power supply comprises at least one of information about unpredictable, sustainable and off-expected.

Example embodiments in accordance with principles of inventive concepts provide an operation method of a storage device including a nonvolatile memory device. The method of operating may include receiving maintaining information of a power supply being supplied from an external device to the storage device, selecting any one of reliability and operation performance with respect to the nonvolatile memory device with reference to the maintaining information, and performing a reliability guarantee operation with respect to the nonvolatile memory device according to a characteristic selected between the reliability and the operation performance. The maintaining information of the power supply includes unpredictable, sustainable and off-expected with respect to the power supply. The reliability guarantee operation includes memory management operation corresponding to best-effort, not-guaranteed and confirmed.

Example embodiments in accordance with principles of inventive concepts include a method of operating a storage device including a nonvolatile memory device comprising: receiving power state information representing a state of power being supplied from a host to the storage device; determining a power state of the storage device according to a change of the power state information; selecting at least one of a plurality of reliability levels with respect to the nonvolatile memory device according to the determined power state; and performing a reliability guarantee operation with respect to the nonvolatile memory device corresponding to the selected at least one reliability level, wherein the power state is one of three predictability states, including unpredictable state, sustainable state, and off-expected state with respect to the power supply.

Example embodiments in accordance with principles of inventive concepts include a method of operating a storage device wherein after power is first supplied, the power state is initialized to the unpredictable state.

Example embodiments in accordance with principles of inventive concepts include a method of operating storage device wherein the reliability level comprises at least three levels, including a best-effort, a not-guaranteed and a confirmed.

Example embodiments in accordance with principles of inventive concepts include a method of operating a storage device wherein when the reliability level is determined as best-effort, a backup operation with respect to data being written in the nonvolatile memory device or a backup operation with respect to meta data of the data being written in the nonvolatile memory device is repeatedly performed within a first period.

Example embodiments in accordance with principles of inventive concepts include a method of operating a storage device wherein when the reliability level is determined as the not-guaranteed, a backup operation with respect to data being written in the nonvolatile memory device or a backup operation with respect to meta data of the data being written in the nonvolatile memory device is repeatedly performed within a second period longer than the first period.

Example embodiments in accordance with principles of inventive concepts include a method of operating a storage device wherein in the case that the reliability level is determined as the not-guaranteed, any one of a backup operation with respect to data being written in the nonvolatile memory device and a backup operation with respect to meta data of the data being written in the nonvolatile memory device is selectively performed.

Example embodiments in accordance with principles of inventive concepts include a method of operating a storage device wherein when the reliability level is determined as not-guaranteed, at least one of an erase count, cell characteristic information and program order information with respect to a selected memory block of the nonvolatile memory device is periodically backed up.

Example embodiments in accordance with principles of inventive concepts include a method of operating a storage device wherein when the reliability level is determined as confirmed, a backup operation with respect to data being written in the nonvolatile memory device and a backup operation with respect to meta data of the data being written in the nonvolatile memory device is performed once.

Example embodiments in accordance with principles of inventive concepts include a method of operating a storage device wherein a reliability level of best-effort is determined in a power state corresponding to unpredictable, a reliability level of not-guaranteed is determined in a power state corresponding to sustainable and a reliability level of the confirmed is determined in a power state corresponding to off-expected.

Example embodiments in accordance with principles of inventive concepts include a method of operating a storage device wherein if a write command is provided from the host in a power state corresponding to off-expected, the power state transitions to unpredictable.

Example embodiments in accordance with principles of inventive concepts include a method of operating a storage device wherein the nonvolatile memory device comprises a three-dimensional memory array including a charge trap layer.

Example embodiments in accordance with principles of inventive concepts include a storage device including a nonvolatile memory device; and a memory controller configured to control the nonvolatile memory device according to a request from a host, wherein the memory controller receives state information with respect to a power supply provided from the host to determine a reliability level with respect to an access operation of the nonvolatile memory device and performs a reliability guarantee operation corresponding to the determined reliability level, and wherein the state information with respect to a power supply comprises at least one of three predictability levels including: unpredictable, sustainable, and off-expected.

Example embodiments in accordance with principles of inventive concepts include a storage device wherein when the state information corresponds to the unpredictable, the memory controller is configured to perform a reliability guarantee operation corresponding to a highest level among the reliability levels.

Example embodiments in accordance with principles of inventive concepts include a storage device wherein when the state information is sustainable, the memory controller is configured to perform a reliability guarantee operation corresponding to a lowest level among the reliability levels and at least one of an erase count, cell characteristic information and program order information with respect to a selected memory block of the nonvolatile memory device is periodically backed up.

Example embodiments in accordance with principles of inventive concepts include a storage device wherein when the state information corresponds to the off-expected, the memory controller is configured to perform a backup with respect to data being written in a selected memory block of the nonvolatile memory data being written in a selected memory block of the nonvolatile memory device once.

Example embodiments in accordance with principles of inventive concepts include a storage device including a nonvolatile memory device; and a memory controller configured to control the nonvolatile memory device in response to a request from a host, wherein the memory controller is configured to employ state information related to the confidence level of a power supply to determine a reliability level with respect to an access operation of the nonvolatile memory device and to perform a reliability guarantee operation corresponding to the determined reliability level.

Example embodiments in accordance with principles of inventive concepts include a storage device wherein the memory controller is configured to set a backup period corresponding to a reliability level as a part of a reliability guarantee operation.

Example embodiments in accordance with principles of inventive concepts include a storage device wherein the memory controller is configured to set a backup period for data.

Example embodiments in accordance with principles of inventive concepts include a storage device wherein the memory controller is configured to set a backup period for meta-data.

Example embodiments in accordance with principles of inventive concepts include a storage device wherein the memory controller is configured to set a relatively long backup period corresponding to a high level of confidence in the availability of the power supply.

BRIEF DESCRIPTION OF THE FIGURES

Example embodiments of inventive concepts will be described below in more detail with reference to the accompanying drawings. The embodiments of inventive concepts may, however, be embodied in different forms and should not be constructed as limited to the embodiments set forth herein. Rather, these embodiments are provided so that this disclosure will be thorough and complete, and will fully convey the scope of inventive concepts to those skilled in the art. Like numbers refer to like elements throughout.

FIG. 4 is a table illustrating types and transition conditions of PSI (power state information) of inventive concepts.

FIG. 6 is a table illustrating a reliability level being performed in different power states and the consequential memory management operation.

DETAILED DESCRIPTION

Figure 1:
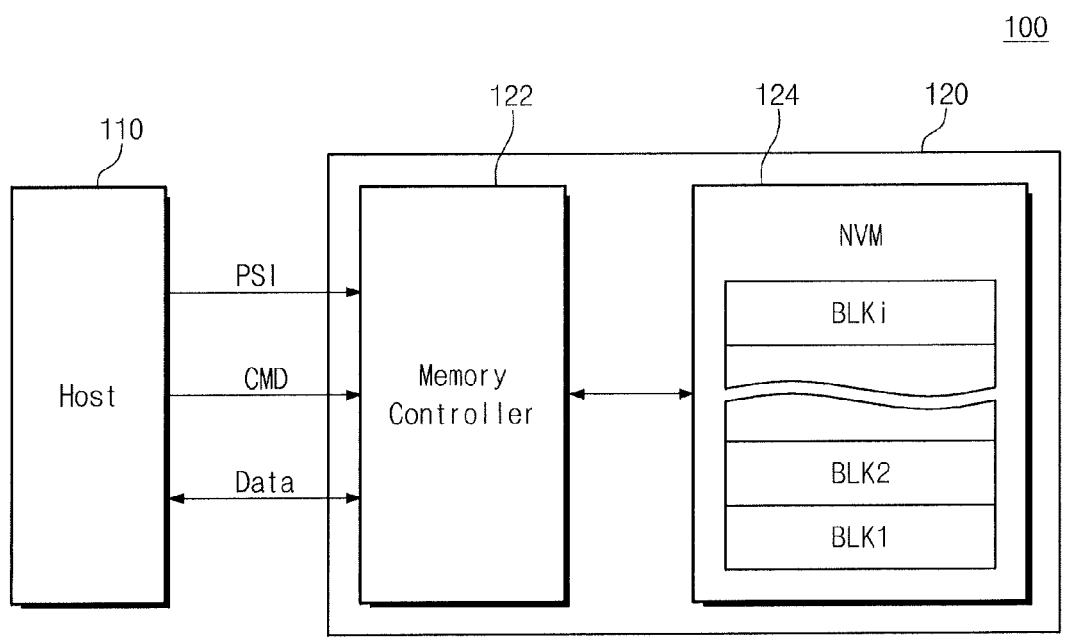
FIG. 1 is a block diagram illustrating a user device in accordance with Example embodiments of inventive concepts.

Embodiments of inventive concepts will be described more fully hereinafter with reference to the accompanying drawings, in which embodiments of the inventive concepts are shown. Inventive concepts may, however, be embodied in many different forms and should not be construed as limited to the embodiments set forth herein. Rather, Example embodiments are provided so that this disclosure will be thorough and complete, and will fully convey the scope of inventive concepts to those skilled in the art Accordingly, known processes, elements, and techniques are not described with respect to some of the embodiments of inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the Example terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "Example" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein. A NAND type flash memory is used as a nonvolatile storage medium for explaining a characteristic and a function of inventive concepts as an illustration. However, those of ordinary skill in the art can appreciate other advantages and performance of inventive concepts according to contents specified here. For example, inventive concepts may be used in a PROM, a MRAM, a ReRAM, a NOR flash memory, etc.

Inventive concepts may be embodied or applied through other embodiments. It is further noted that various modifications may be made without departing from the spirit and scope of inventive concepts.

FIG. 1 is a block diagram illustrating a user device in accordance with Example embodiments of inventive concepts. Referring to FIG. 1, the user device 100 may include a host 110 and a storage device 120. The storage device 120 may include a memory controller 122 and a nonvolatile memory device 124.

The host 110 may be one of various electronic devices using the storage device 120 as storage. For example, the host 110 may be a smart phone or a smart pad fitted with the storage device 120. However, embodiments of the host 110 are not limited thereto and the host 110 may be any of various devices using the storage device 120 as storage. The host 110 can provide PSI (power state information) to the storage device 120. The PSI represents state information with respect to power supply being supplied to the storage device 120 by the host 110.

The PSI refers to information about an interruption or a maintaining state of power provided by the host 110. For example, the host 110 may transmit PSI that guarantees a stable power supply to the storage device 120. The host 110 may indicate that it will interrupt a power supply being provided to the storage device 120 soon through the PSI.

The PSI may be generated with reference to a power supply state, an operation mode, or a battery charge state of the host 110. In Example embodiments host 110 may provide the generated PSI to the storage device 120 through a vender-specific command. The PSI may be provided to the storage device using existing legacy commands. For example, the PSI may be transmitted using reserved bits of command sequence. The PSI may also be provided to the storage device 120 through a variety of control signals or state signals.

The memory controller 122 of the storage device 120 may be configured to control the nonvolatile memory device 124 in response to a request of the host 110, The memory controller 122 interfaces with the host 110 and the nonvolatile memory device 124. The memory controller 122 may access a selected memory block of the nonvolatile memory device 124 in response to a request of the host 110. The memory controller 122 may change a level of a reliability operation with respect to the nonvolatile memory device 124 in response to PSI from the host 110, For example, if the PSI indicates that stable power is guaranteed, the memory controller 122 relies upon the host's guarantee for data reliability and may operate in a mode focusing on performance. On the other hand, if a notice of a power interruption or instability is given by the PSI, the memory controller 122 may control the nonvolatile memory device to place a highest priority on data reliability.

In Example embodiments nonvolatile memory device 124 performs erase, read and write operations under the control of the memory controller 122, The nonvolatile memory device 124 includes a plurality of memory blocks BLK1~BLKi and each memory block includes a plurality of memory cells arranged in rows and columns. Each memory block constitutes an erase unit. The nonvolatile memory device 124 may write write-requested data in a corresponding block or perform a block erase operation on an erase-requested memory block according to a command and a control signal provided from the memory controller 122.

In Example embodiments nonvolatile memory device 124 may include memory blocks formed with a three-dimensional (3D) memory array. The 3D memory array may be monolithically formed in one or more physical levels of arrays of memory cells having an active area disposed above a silicon substrate and circuitry associated with the operation of those memory cells, whether such associated circuitry is above or within such substrate. In Example embodiments, the term "monolithic" means that layers of each level of the array are directly deposited on the layers of each underlying level of the array.

In an Example embodiment in accordance with principles of inventive concepts, the 3D memory array includes vertical NAND strings that are vertically oriented such that at least one memory cell is located over another memory cell. The at least one memory cell may include a charge trap layer, for example. In Example embodiments, each vertical NAND string may include at least one select transistor located over memory cells, the at least one select transistor having the same structure with the memory cells and being formed monolithically together with the memory cells.

The following patent documents, which are hereby incorporated by reference, describe configurations for three-dimensional memory arrays, in which the three-dimensional memory array is configured as a plurality of levels, which word lines and/or bit lines shared between levels: U.S. Pat. Nos. 7,679,133; 8,553,466; 8,654,587; 8,559,235; and US Pat. Pub. No. 2011/0233648.

According to the user device 100, the memory controller 122 may be provided with PSI from the host 110. The memory controller can adjust a reliability level of data being accessed according to the PSI. That is, according to the PSI, the memory controller 122 may decrease a reliability level to increase operation performance or increase a reliability level to decrease operation performance. In this manner, the storage device 120 may dynamically perform a reliability guarantee with respect to data according to PSI being provided from the host 110. By adjusting a reliability guarantee level using the PSI being provided from the host 110, the storage device 120 can increase reliability and performance of the data and extend its lifespan.

Figure 2:
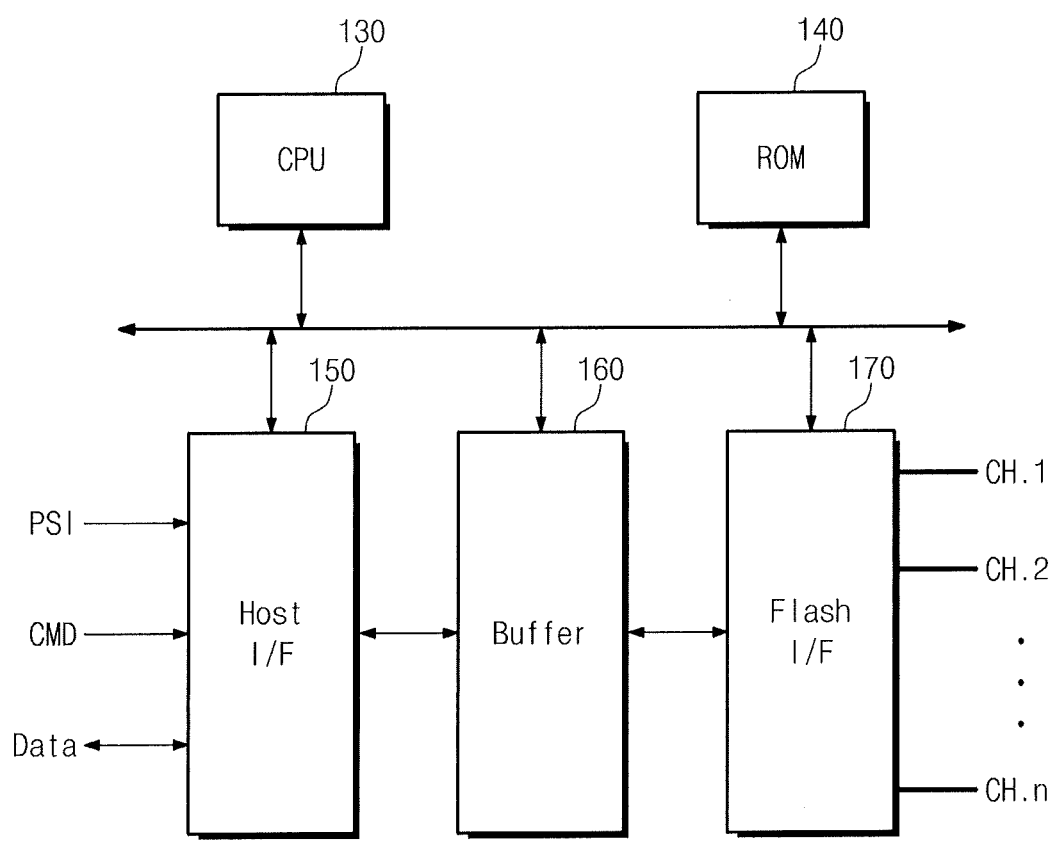
FIG. 2 is a block diagram illustrating a memory controller of FIG. 1.

FIG. 2 is a block diagram illustrating a memory controller of FIG. 1. Referring to FIG. 2, the memory controller 122 may include a CPU (central processing unit) 130, a ROM 140, a host interface 150, a buffer 160, and a flash interface 170.

The host interface 150 provides an interface with the host 110 (refer to FIG. 1). The flash interface 170 provides an interface with the nonvolatile memory device 124 (refer to FIG. 1). The host interface 150 may be connected to the host 110 through at least one channel (or port). In Example embodiments the host interface 150 may be connected to the host 110 through either of two channels, for example, a PATA (Parallel AT Attachment) bus and a SATA (Serial AT Attachment) bus. The host interface 150 may be connected to the outside through the PATA bus and the SATA bus. The host interface 150 may be connected to the outside through SCSI, USB, eMMC, UFS (universal flash storage) interface, etc., for example.

The CPU 130 can control overall operation (for example, a read, a write, a file system management, a FTL management, etc.) of the memory controller 122. For example, the CPU 130 can drive firmware such as a FTL (flash translation layer) stored in the ROM 140. In addition, although not illustrated in the drawing, the memory controller 122 may further include a RAM as a working memory or a cache. The memory controller 122 may include the buffer 160 temporarily storing data being exchanged between the host 110 and the nonvolatile memory device 124.

Host interface 150 decodes PSI being provided from the host 110 to transmit the decoded PSI to the memory controller 122. The PSI being provided to the host interface 150 may be provided through, for example, a vender-specific command. The PSI may be transmitted to the host interface 150 using reserved bits included in a legacy command. The host interface 150 can store the transmitted PSI in a register included in the inside of the host interface 150 or in the memory controller 122. After receiving the PSI, the memory controller 122 determines a reliability level with respect to data being stored in the nonvolatile memory device 124 with reference to the PSI stored in the register.

Figure 3:
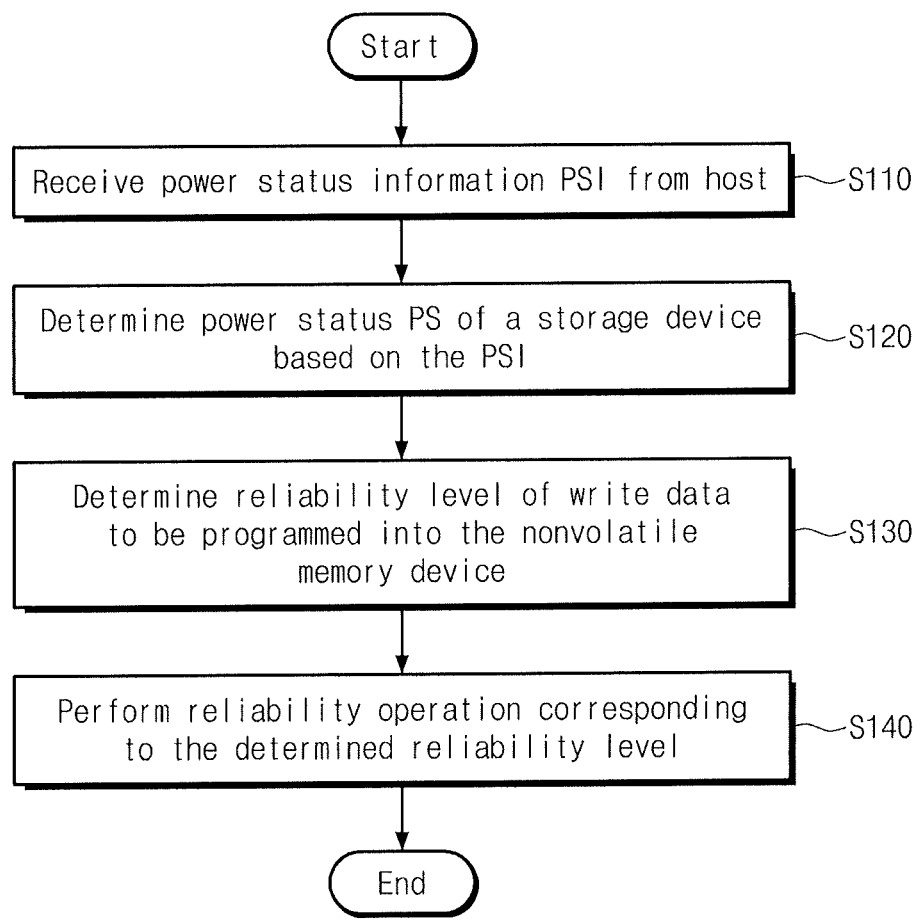
FIG. 3 is a flowchart illustrating an operation method of a memory controller of FIG. 1 or 2.

FIG. 3 is a flowchart illustrating Example operation of a memory controller of FIG. 1 or 2. Referring to FIG. 3, the memory controller 122 transits a PS (power state) of the storage device 120 with reference to PSI being provided from the host 110. The storage device 120 performs an access operation to the nonvolatile memory device 124 with a reliability level being differentiated according to the PS.

In a step S110, the memory controller 122 receives PSI (power state information) from the host 110. The PSI is state information that reflects a battery state or a charge state of power supply that operates in the host 110. The PSI corresponds to maintenance or prediction information with respect to a power supply being provided to the storage device 120 from the host 110. That is, in Example embodiments in accordance with principles of inventive concepts, PSI may indicate the likelihood of power interruption to storage device 120 and, although it may include any number of states, or levels, in this Example embodiment it includes at least 3 states: unpredictable state, referred to herein as, "Unpredictable," sustainable state, referred to herein as, "Sustainable," and off-expected state, referred to herein as, "Off-expected," which may be provided from the host 110. Each state indicates a different level of confidence in the future availability of the power supply with, for example, the sustainable state indicating that power appears to be available indefinitely (reflecting, for example, a fully charged battery), the off-expected state indicating that power is definitely to be removed in the near future (reflecting, for example, a power-down initiation), and unpredictable, indicating an intermediate level of confidence in the continued availability of the power source, one which may be consistent with neither an indication of an imminent power-down nor a fully-charged battery, for example.

In a step S120, the memory controller 122 determines Power State PS of the storage device 120 based on the received PSI. The PS refers to a PS of the storage device 120 being transited by information or instructions being provided from the host 110. States of the unpredictable, the sustainable and the off-expected being provided from the host 110 may exist in the PS. In Example embodiments in which information about the PS described by the host 110 is directly provided by the host, an operation of determining PS of the memory controller 122 may be omitted. In the case of providing an indirect instruction corresponding to the PSI, through various types of legacy commands from the host 110, for example, a procedure of determining PS may be executed in the storage device 120.

In a step S130, the memory controller 122 determines a reliability level with respect to data being access-requested, for example, write data according to a PS. The reliability level may be an operation level for maintaining the highest data reliability in the storage device 120. As the reliability level becomes high, operation performance of the storage device 120 is relatively reduced. That is, performance, in the form of operational speed, for example, of the storage device may be reduced in order to ensure the reliability of data stored in storage device 120.

In a step S140, the memory controller 122 performs a reliability operation corresponding to the determined reliability level. The memory controller 122 may perform a reliability operation according to the determined reliability level by changing a period of a data backup and a meta data backup, or selectively performing the data backup and the meta data backup, for example.

As a reliability level increases, operation speed and channel bandwidth of the storage device 120 may be correspondingly reduced. That is, as a reliability level becomes high, performance of the storage device 120 may be degraded. On the other hand, as a reliability level becomes low, performance of the storage device 120 may be increased. Consequently, the storage device 120 may select any one of reliability prioritized operation mode and performance prioritized operation mode according to a PSI being provided from the host 110.

FIG. 4 is a table illustrating an Example embodiment of types and transition conditions of PSI (power state information) in accordance with principles of inventive concepts. Referring to FIG. 4, a PS (power state) may be classified into one of three states according to a PSI (power state information) being provided from the host 110. In Example embodiments PS may be represented by an unpredictable state Unpredictable, a sustainable state Sustainable, and off-expected state Off-expected. The Power-On state or Power-Off state is not a state defined by the PSI being provided from the host 110 but substantially represents whether a power supply is provided or interrupted.

If user device 100 is booted or the storage device 120 is built in the host 110, the storage device 120 enters a power-on state Power On. If power is supplied and then the storage device 120 enters a power-on state Power On, a PS with respect to the storage device 120 immediately transits to unpredictable state Unpredictable, in accordance with principles of inventive concepts.

When a current PS is an unpredictable state Unpredictable, a next PS maintains the unpredictable state Unpredictable or may transit to a sustainable state Sustainable or to an off-expected state Off-Expectable. Power may also be inadvertently cut off by a sudden power off. If additional PSI is not provided from the host 110 in the unpredictable state Unpredictable, the PS may maintain the unpredictable power state Unpredictable. If a PSI being provided from the host 110 exists, that is, if PSI is provided by the host 110, the unpredictable state Unpredictable may transit to the sustainable state Sustainable or the off-expected state Off-Expected, according to the PSI.

When a current PS corresponds to the sustainable state Sustainable, a next PS may transit to the sustainable state Sustainable or the off-expected state Off-Expected according to an instruction or information of the host 110. If a separate PSI is not provided from the host 110, the memory controller 122 maintains the sustainable state Sustainable. A power supply being provided to the storage device 120 may also be inadvertently cut off by a sudden power off.

When a current PS corresponds to the off-expected state Off-Expected, a next PS may transit to the unpredictable state Unpredictable or the sustainable state Sustainable according to a command or an instruction of the host 110. If a separate PSI is not provided from the host 110, the next PS maintains the off-expected state Off-Expected and, after predetermined time goes by, the next PS becomes a power off state Power-Off. If a write request is provided from the host 110 in the off-expected state Off-Expected, the memory controller 122 may restore the PS to the unpredictable state Unpredictable.

Figure 5:
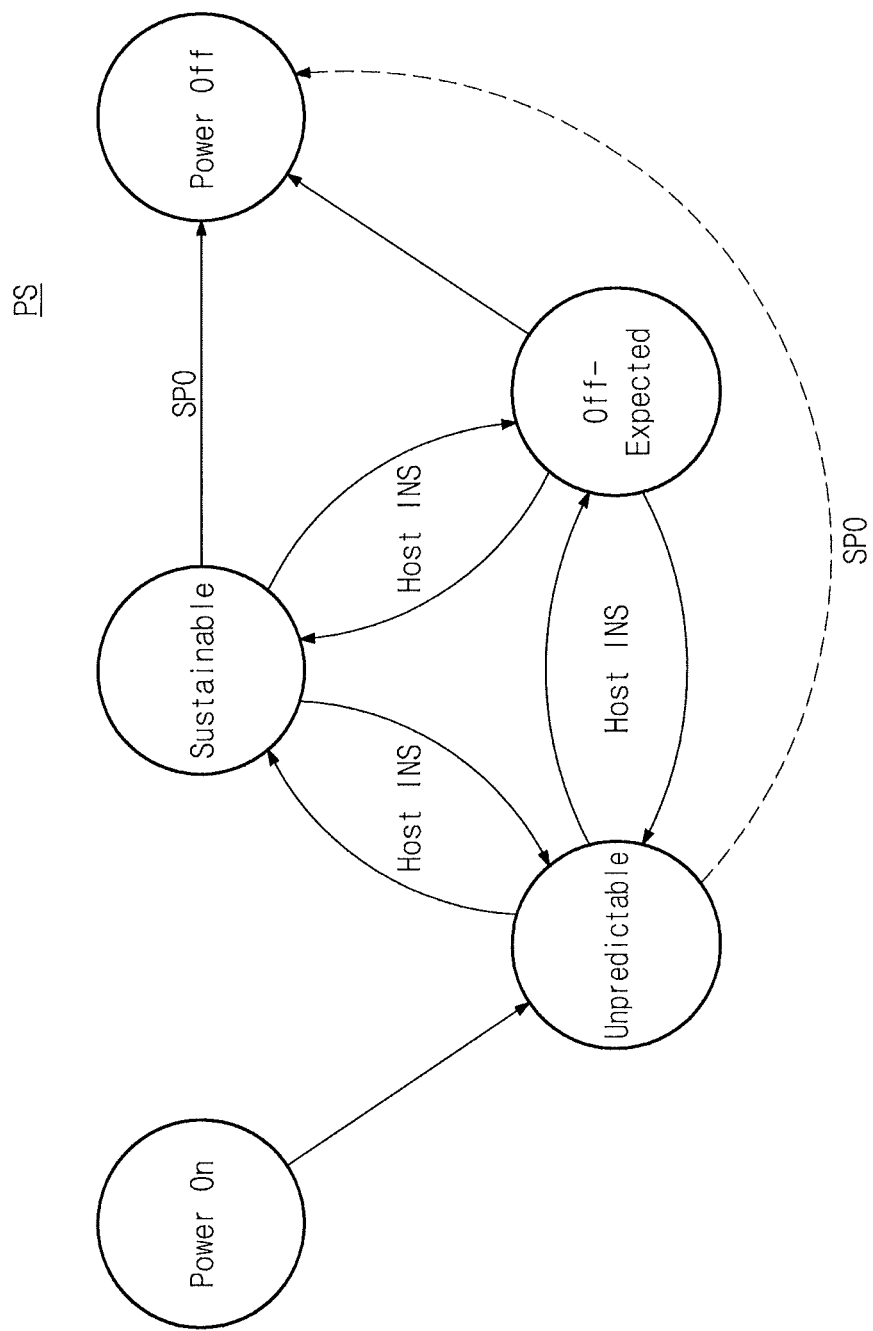
FIG. 5 is a state transition diagram illustrating transition conditions of a PS (power state) of inventive concepts.

FIG. 5 is a state transition diagram illustrating transition conditions of a PS (power state) in accordance with principles of inventive concepts. Referring to FIG. 5, if a power supply is provided to the user device 100 or the storage device 120 (that is, if power is provided), a PS (power state) becomes a power-on state Power On. From this moment, a reliability level in the storage device 120 may be changed according to a PSI being provided from the host 110. The power-on state Power On transits, or transitions, to the unpredictable state Unpredictable.

The unpredictable state Unpredictable may transit to any one of three power states (sustainable state Sustainable, off-expected state Off-Expectable, power-off state Power-Off). That is, in Example embodiments in accordance with principles of inventive concepts, if a PSI guaranteeing power being provided to the storage device 120 by the host 110 is provided, a PS of the storage device 120 may transit to the sustainable state Sustainable; if storage device 120 receives a PSI representing that power being provided to the storage device 120 by the host 110 is to be cut, the storage device 120 manages the PS as the off-expected state Off-Expected; and if power being provided from the host 110 is cut off (inadvertently, for example) by a sudden power off, the PS of the storage device 120 may transit to the power-off state Power-Off.

The sustainable state may transit to any one of three power states (unpredictable state Unpredictable, off-expected state Off-Expected, power-off state Power-Off). That is, in Example embodiments in accordance with principles of inventive concepts, if a PSI that power being provided from the host 110 to the storage device 120 is unpredictable is provided, a PS of the storage device 120 may transit to the unpredictable state Unpredictable; if storage device 120 receives a PSI representing that power being provided to the storage device 120 by the host 110 is to be cut, the storage device 120 manages the PS as the off-expected state Off-Expected; and if power being provided from the host 110 is cut off by a sudden power off, the PS of the storage device 120 may transit to the power-off state Power-Off.

The off-expected state Off-Expected may transit to any one of three power states (unpredictable state Unpredictable, sustainable state Sustainable, power-off state Power-Off). That is, in Example embodiments in accordance with principles of inventive concepts, if a PSI that power being provided from the host 110 is unpredictable is provided, a PS of the storage device 120 may transit to the unpredictable state Unpredictable; if a PSI guaranteeing power being provided to the storage device 120 by the host 110 is provided, a PS of the storage device 120 may transit to the sustainable state Sustainable; and if power being provided from the host 110 is inadvertently cut off by a sudden power off, the PS of the storage device 120 may transit to the power-off state Power-Off.

According to each state transition condition illustrated in the state transition diagram described above, the memory controller 122 can control a PS of the storage device 120. According to a transition of a PS, the memory controller 122 may control and manage a reliability guarantee level with respect to the nonvolatile memory device 124. That is, in Example embodiments in accordance with principles of inventive concepts, in each power state of the sustainable state Sustainable, the off-expected state Off-Expected and the unpredictable state Unpredictable, the storage device 120 can manage the nonvolatile memory device 124 in reliability operation modes of different levels.

FIG. 6 is a table illustrating a reliability level being performed in different power states and the consequential memory management operation. Referring to FIG. 6, a reliability level corresponding to each PS (power state) and a data backup operation and a meta-data backup operation corresponding to the reliability levels respectively are illustrated.

Data backup refers to an operation of backing up at least one page among a plurality of logical pages after a program with respect to any one physical page is completed. In accordance with principles of inventive concepts, the at least one logical page may be backed up to a specific area of the nonvolatile memory device 124. Although a SPO (sudden power off) may occur during a program operation, a logical page backed up can be preserved. For example, the data backup may be a LSB (least significant bit) among the logical pages. The meta data backup refers to an operation of backing up control information about programmed data to a nonvolatile memory area. In accordance with principles of inventive concepts, if performing the meta backup, even during a SPO (sudden power off), a restoration of corresponding data is possible.

When a power state PS is the unpredictable state Unpredictable, the memory controller 122 manages data stored in the nonvolatile memory device 124 as reliability guarantee level of a best-effort. In the reliability guarantee level of best-effort, the data backup or the meta data backup can be periodically or conditionally performed. In a reliability level corresponding to best-effort, the memory controller 122 may perform the data backup or perform the meta data backup over a relatively short period of time. In a reliability level corresponding to best-effort, the memory controller 122 may perform the data backup or perform the meta data backup every time when a size of write data exceeds a reference value, for example.

When a power state PS corresponds to the sustainable state, the memory controller 122 manages data stored in the nonvolatile memory device 124 as a reliability guarantee level corresponding to not guaranteed. In the reliability level of not guaranteed, the memory controller 122 may not perform a data backup or may perform a data backup over a relatively long period of time (that is, less frequently than in the reliability guaranteed state, for example). In the reliability level of not guaranteed, the memory controller 122 may perform only any one of a data backup operation and a meta backup operation over a relatively long period of time.

Even in a PS of the sustainable state Sustainable, a power supply of the host 110 may be cut off by an unexpected cause. In accordance with principles of inventive concepts, to prepare for a state like a SPO (sudden power off), even in a PS of the sustainable state, the memory controller 122 may perform a minimum reliability guarantee operation. For example, the memory controller 122 may periodically back up an erase count being counted up by a block erase to the nonvolatile memory device 124. In addition, in the case that a change of a cell mode of a memory block in which data is written exists, the memory controller 122 backs up the erase count information to the nonvolatile memory device 124. Cell mode information is defined when a memory cell is used as a MLC (multilevel cell) or a SLC (single level cell). In the case that a change of a program order according to a word line or a page occurs in a memory block, a corresponding memory block and program order information may be backed up to the nonvolatile memory device 124 by the memory controller 122. The erase count, the cell mode information and the program order information described above are control information that cannot be guaranteed by the host 110. In Example embodiments in accordance with principles of inventive concepts, even in a PS of the sustainable state which is a guarantee state of a power supply by the host 110, the erase count, the cell mode information and the program order information may be backed up as a minimum reliability guarantee operation.

When a power state PS corresponds to the off-expected state Off-Expected, the memory controller 122 manages data stored in the nonvolatile memory device 124 as a reliability guarantee level corresponding to Confirmed. In a reliability level of Confirmed, the memory controller 122 may not absolutely perform a reliability guarantee operation after performing data backup and meta data backup once. Unless a PSI is not changed, the memory controller 122 may not absolutely perform any memory management operation except the first backup operation in the off-expected state Off-Expected.

Reliability guarantee levels corresponding to each PS and illustrative reliability guarantee operations corresponding to each of the reliability guarantee levels were described. Those reliability guarantee operations are only illustrative operations and various operations may be subdivided into various levels to be performed, for example.

Figure 7:
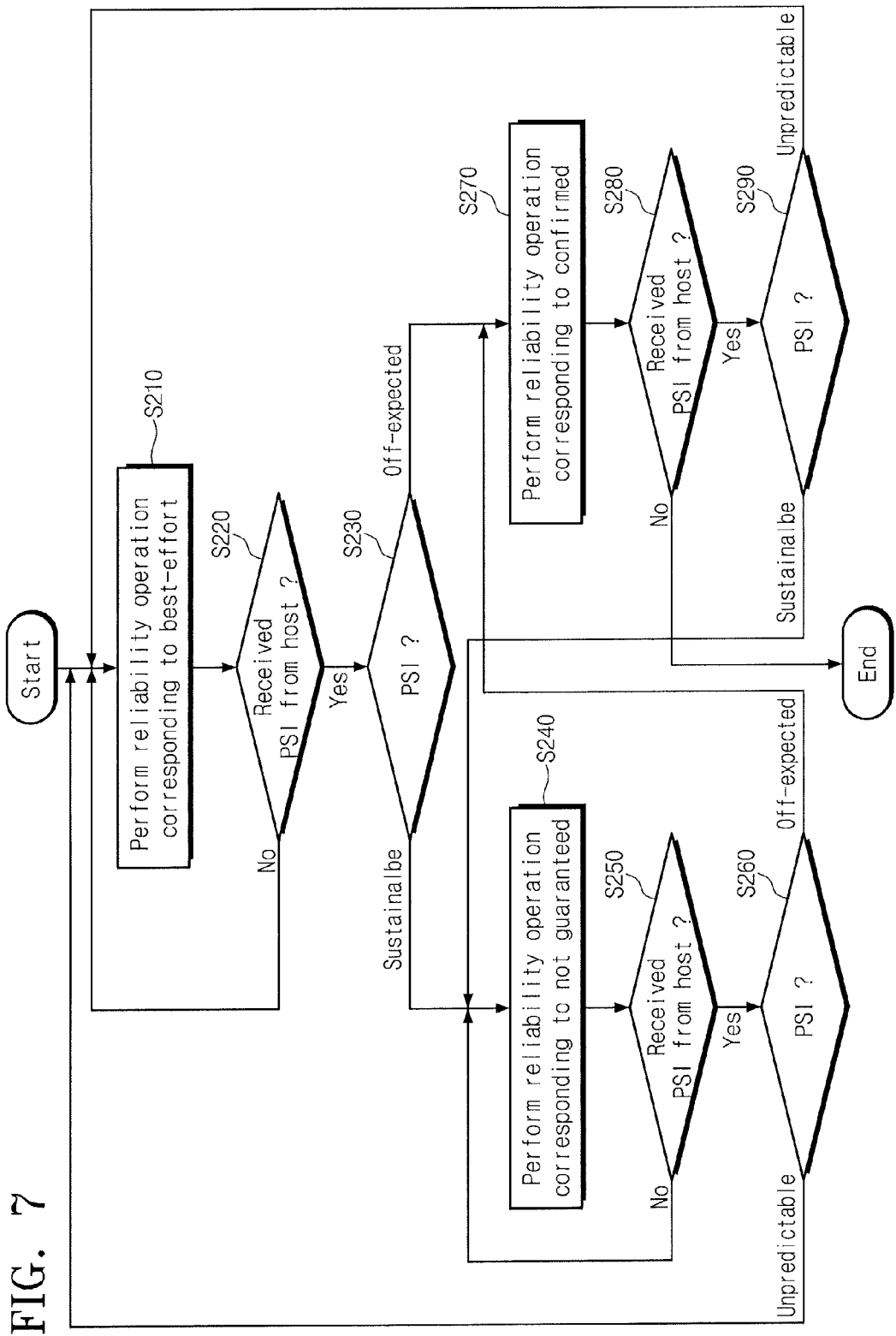
FIG. 7 is a flowchart illustrating a reliability guarantee method being performed in response to power state information of a memory controller of inventive concepts.

FIG. 7 is a flowchart illustrating an Example embodiment of a reliability guarantee method being performed in response to power state information of a memory controller in accordance with principles of inventive concepts. Referring to FIG. 7, the memory controller 122 determines a PS (power state) in response to power-on and a PSI (power state information) from the host 110 and performs a reliability guarantee operation corresponding to each PS. If a power supply is supplied to the storage device 120, that is, if power is supplied to storage device 120, a procedure in accordance with principles of inventive concepts begins.

In a step S210, the memory controller 122 transitions a PS to the unpredictable state Unpredictable immediately after being powered on. The unpredictable state Unpredictable may be regarded as a default value with respect to a PS of the storage device 122. In the unpredictable state Unpredictable, the memory controller 122 manages data stored in the nonvolatile memory device 124 as a reliability level of a best-effort. In the reliability level of the best-effort, the data backup or the meta data backup may be periodically or conditionally performed. In the reliability level corresponding to the best-effort, the memory controller 122 may perform the data backup or the meta data backup over a relatively short period of time, that is, relatively frequently. In the reliability level corresponding to the best-effort, the memory controller 122 may perform the data backup or the meta data backup at every time when a size of write data exceeds a reference value, for example.

In a step S220, the memory controller 122 monitors whether a change of a PSI from the host 110 exists. If a change of a PSI from the host 110 does not exist (No direction), the procedure goes back to the step S210 to control the nonvolatile memory device 124 according to a reliability level corresponding to the best-effort. If a change of a PSI from the host 110 exists, the procedure goes to a step S230.

In the step S230, the memory controller 122 performs an operation branch off according to a change of a PSI being provided from the host 110. In the case that a changed PSI corresponds to the sustainable state Sustainable, the procedure goes to a step S240. In the case that a PSI changed by the host 110 corresponds to the off-expected state Off-Expected, the procedure goes to a step S270.

In a step S240, the memory controller 122 may manage data being stored in the nonvolatile memory device 124 according to a reliability level corresponding to Not-guaranteed. In the reliability level corresponding to Not-guaranteed, the memory controller 122 may not perform a data backup or may perform a data backup over a relatively long period of time, that is, relatively infrequently. In the reliability level corresponding to Not-guaranteed, the memory controller 122 may perform only any one of a data backup operation and a meta data backup operation. In addition, in the reliability level corresponding to Not-guaranteed, the memory controller 122 may perform a backup operation on control information that cannot be guaranteed in the host 110 such as an erase count, cell mode information and program order information.

In a step S250, the memory controller 122 monitors whether a change of PSI form the host 110 exists. If a change of PSI form the host 110 does not exist (that is, no direction, or updated PSI from the host), the procedure returns to the step S240. If a change of PSI form the host 110 exists, the procedure goes to step S260.

In the step S260, the memory controller 122 performs an operation branch off according to a change of a PSI being provided from the host 110. In the case that the change PSI corresponds to unpredictable, the procedure returns to the step S210. In the case that the change PSI corresponds to off-expected, the procedure goes to a step S270.

In step S270, the memory controller 122 manages data being stored in the nonvolatile memory device 124 as a Confirmed level of reliability corresponding to off-expected. In a reliability level of off-expected, the memory controller 122 rapidly performs a data backup operation and a meta backup operation once. Reliability of data written before being changed to the PS of the off-expected is guaranteed by the data backup operation and the meta backup operation that are rapidly performed. After that, the memory controller 122 may not perform a reliability guarantee operation with respect to data and prepares for a cut-off of power supply.

In step S280, the memory controller 122 monitors whether a change of PSI form the host 110 exists. If a change of PSI form the host 110 does not exist (No direction), as time goes by, a power supply being supplied to the storage device 120 may be cut off. If a change of PSI from the host 110 exists, the procedure goes to a step S290. For example, although the PSI is an off-expected, a write request urgently occurs may correspond to that the procedure proceeding to step S290.

In step S290, the memory controller 122 performs an operation branch off according to a change of a PSI being provided from the host 110. In the case that the change PSI corresponds to sustainable, the procedure returns to the step S240. In the case that the change PSI corresponds to unpredictable, the procedure goes to step S210.

An Example operation of the memory controller 122 was described which monitors a PSI being provided from the host 110 to adjust a reliability level of data being stored in the nonvolatile memory device. However, in accordance with principles of inventive concepts, the kinds of reliability level and the PSI may be further subdivided.

FIGS. 8A through 8F are timing diagrams sequentially illustrating a reliability guarantee operation based on power statue information being performed in a memory controller in accordance with principles of inventive concepts. In this Example embodiment, an access command CMD with respect to the storage device 120 is limited to a write command Write. However, inventive concepts are not limited thereto and may be applied to an erase or read operation, for example.

Figure 8A:
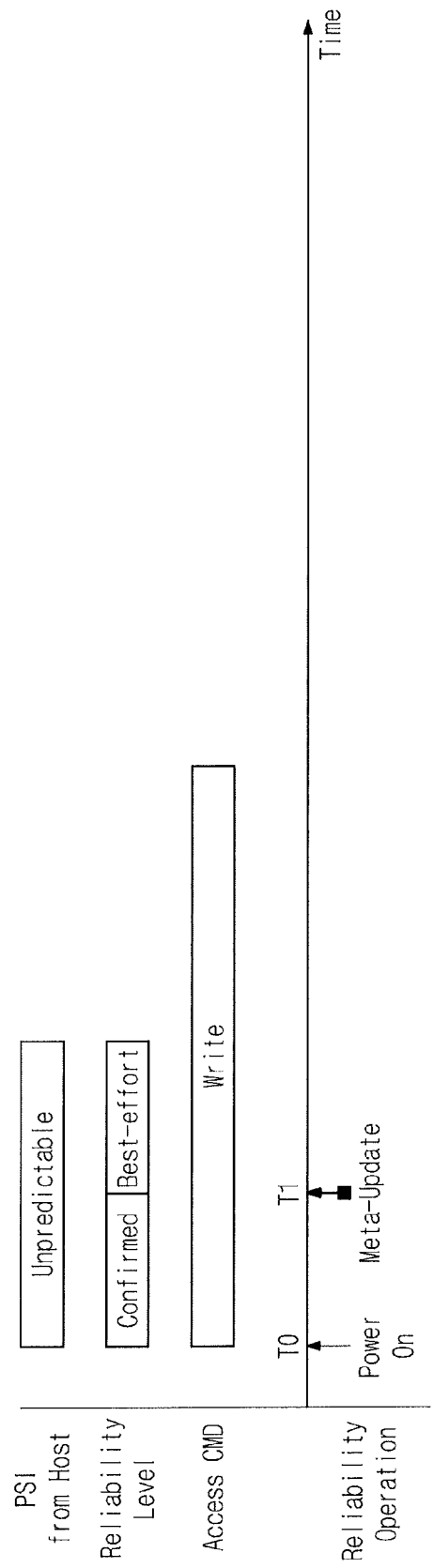
FIGS. 8A through 8F are timing diagrams sequentially illustrating a reliability guarantee operation based on power statue information being performed in a memory controller of inventive concepts.

Referring to FIG. 8A, power is supplied at time of T0 and a PS (power state) of the storage device 120 may be set to an unpredictable. In PS of the unpredictable, the memory controller 122 controls the nonvolatile memory device 124 by a reliability level corresponding to a best-effort. In the reliability level corresponding to the best-effort, the memory controller 122 can perform a backup operation on control information that cannot be guaranteed in the host 110, such as an erase count, cell mode information and program order information.

A meta data backup is performed at time T1. Although only a meta data backup is illustrated here, a backup operation of data can be performed at the same time. For convenience of description, a reliability operation may be represented as a backup of meta data. If a backup of meta data is performed, data written before the time of T1 can be restored even at a time of SPO (sudden power off). Thus, reliability of the data written before the time of T1 can be represented as confirmed and reliability of the data written after the time of T1 can be still represented as best-effort.

Figure 8B:
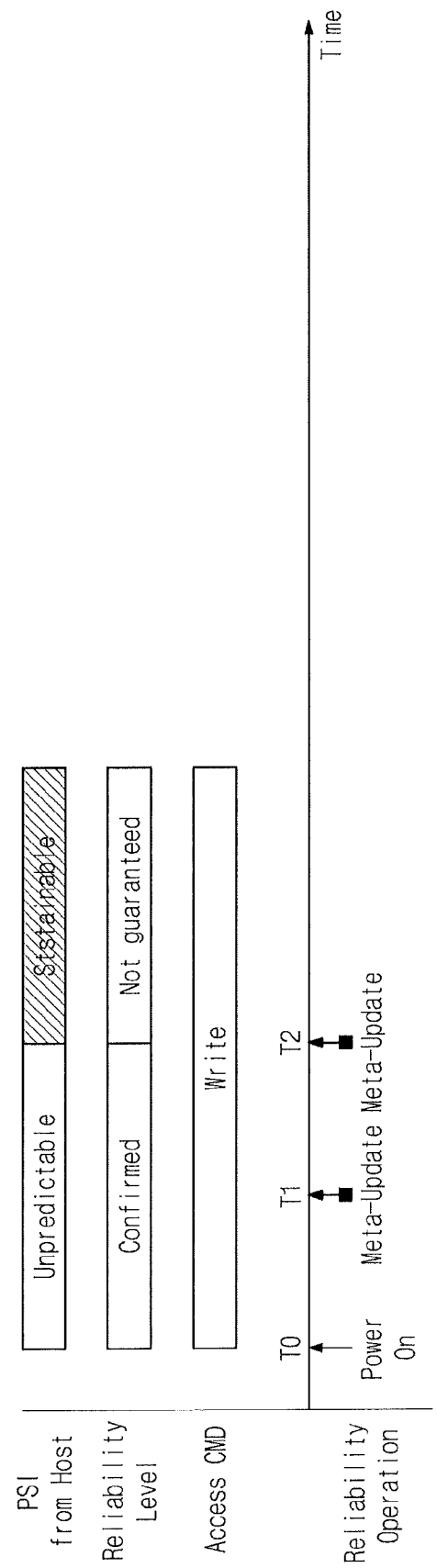

Referring to FIG. 8B, a change of PSI being provided from the host 110 occurs at time T2. In this Example embodiment, the host 110 changes a PSI from unpredictable to sustainable with respect to a power supply being supplied to the storage device 120. Then, a PSI of the storage device 120 may be set to the sustainable. In accordance with principles of inventive concepts, because of a change of PS, the memory controller 122 performs a backup (or update) of meta data. A reliability level of data written before the time T2 at which a backup of meta data is performed is set to confirmed. A reliability level of data written after the time T2 may be managed as Not-guaranteed. In the reliability level of Not-guaranteed, the storage device 120 can drive the nonvolatile memory device at a maximum performance level. However, in the reliability level of Not-guaranteed, the memory controller 122 may back up an erase count, cell mode information and program order information for providing minimum reliability. This is because that information is control information that cannot be guaranteed by the host 110.

Figure 8C:
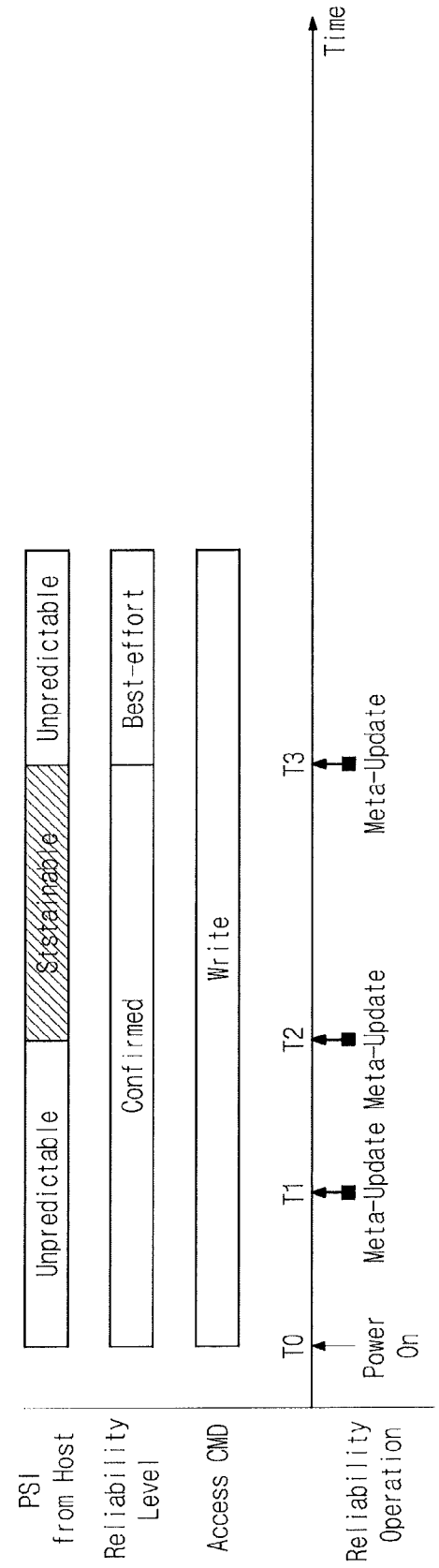

Referring to FIG. 8C, at time T3, a change of PSI being provided from the host 110 occurs. That is, the host 110 changes a PSI from sustainable to unpredictable with respect to a power supply being supplied to the storage device 120. Then, according to a change of PS, the memory controller 122 performs a backup (or update) of meta data at the time of T3. A reliability level of data written before the time T3 at which a backup of meta data is performed is set to confirmed. A reliability level of data written after the time T3 may be managed as the Not-guaranteed.

Figure 8D:
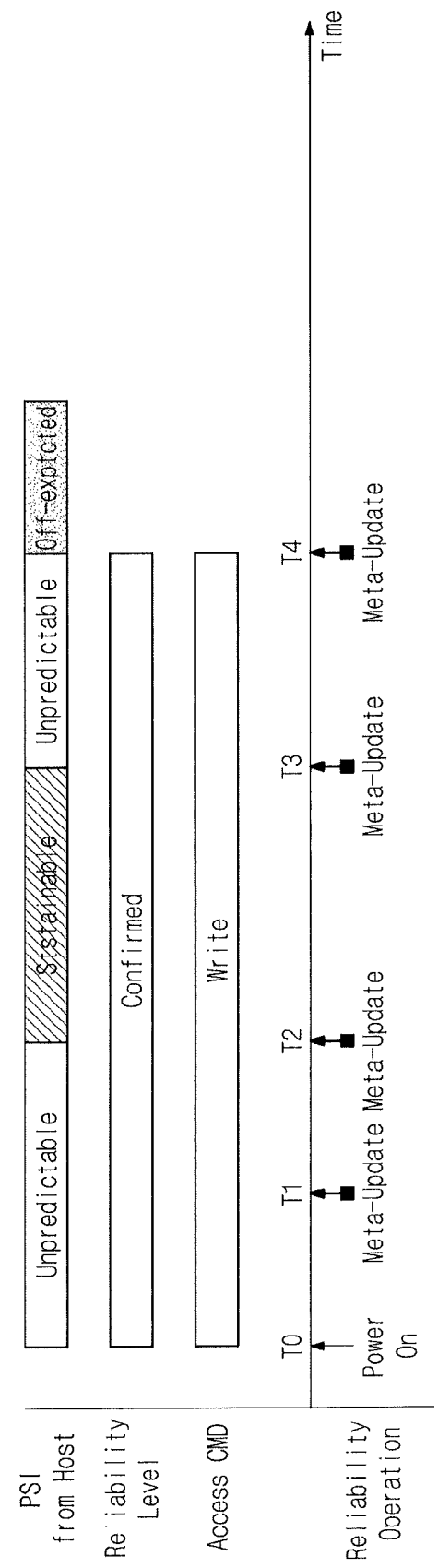

Referring to FIG. 8D, at time T4, a change of PSI provided from the host 110 occurs. That is, the host 110 changes a PSI from unpredictable to off-expected with respect to a power supply being supplied to the storage device 120. Then, according to a change of PS, the memory controller 122 performs a backup (or update) of meta data at the time of T4. A reliability level of data written before the time T4 at which a backup of meta data is performed is set to confirmed. After the time T4, an access operation to the nonvolatile memory device 124 is stopped.

Figure 8E:
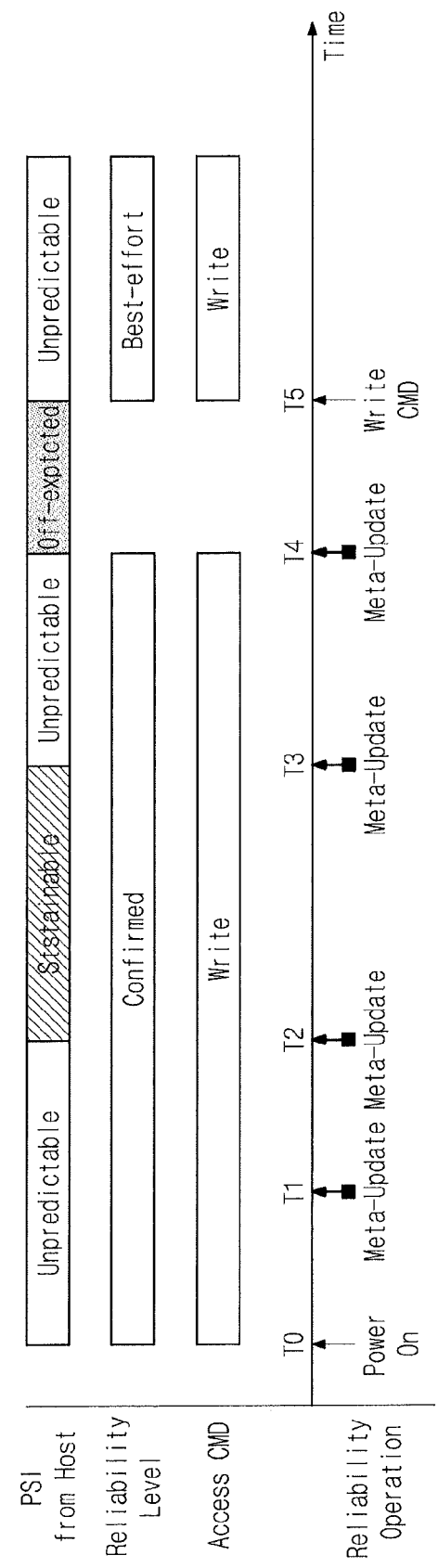

Referring to FIG. 8E, at time T5, a change of PSI provided from the host 110 occurs. In the case that an additional write request occurs at the unpredictable state, this state transition may occur. That is, the host 110 changes a PSI from off-expected to unpredictable with respect to a power supply being supplied to the storage device 120. Then, the memory controller 122 controls the nonvolatile memory device 124 as a reliability level of best-effort, corresponding to a PS of the unpredictable.

Figure 8F:
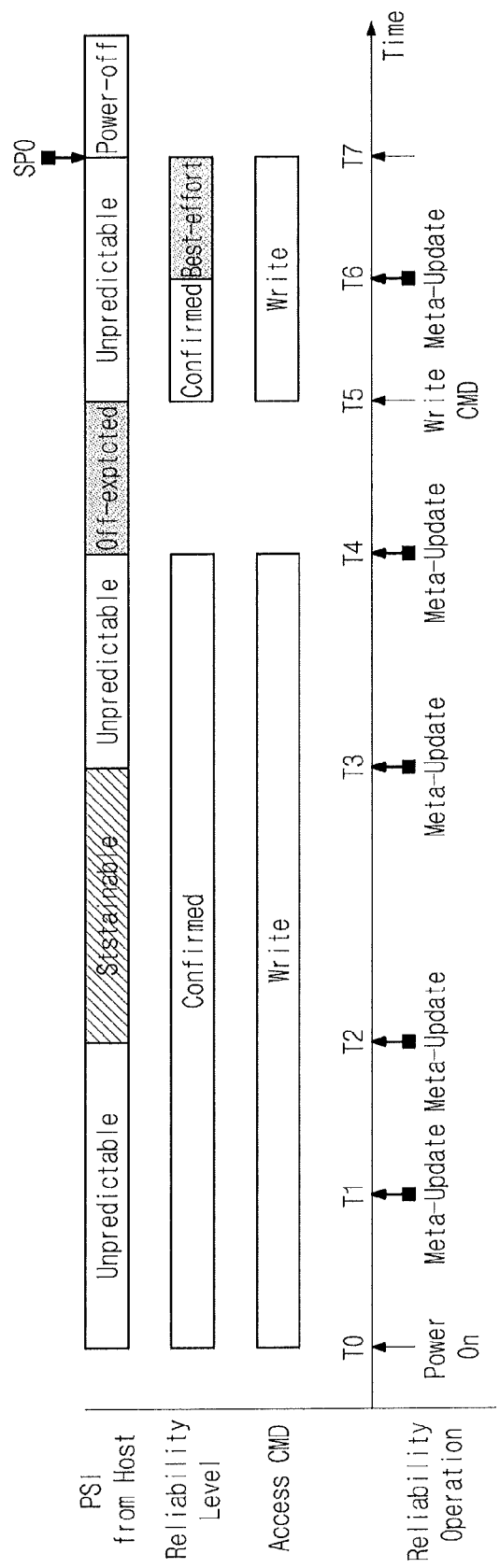

Referring to FIG. 8F, the memory controller 122 performs a backup of meta data at time T6 for a reliability operation of best-effort. If a backup of meta data is performed, data written before the time T6 can be restored even at a time of SPO (sudden power off). Thus, reliability of the data written before the time T6 can be represented as confirmed and reliability of the data written after the time T1 can be still represented as best-effort. If an unintended SPO occurs at time T7, a power supply of the storage device 120 is cut off. However, data at the time of T6 may be restored when being rebooted.

Figure 9A:
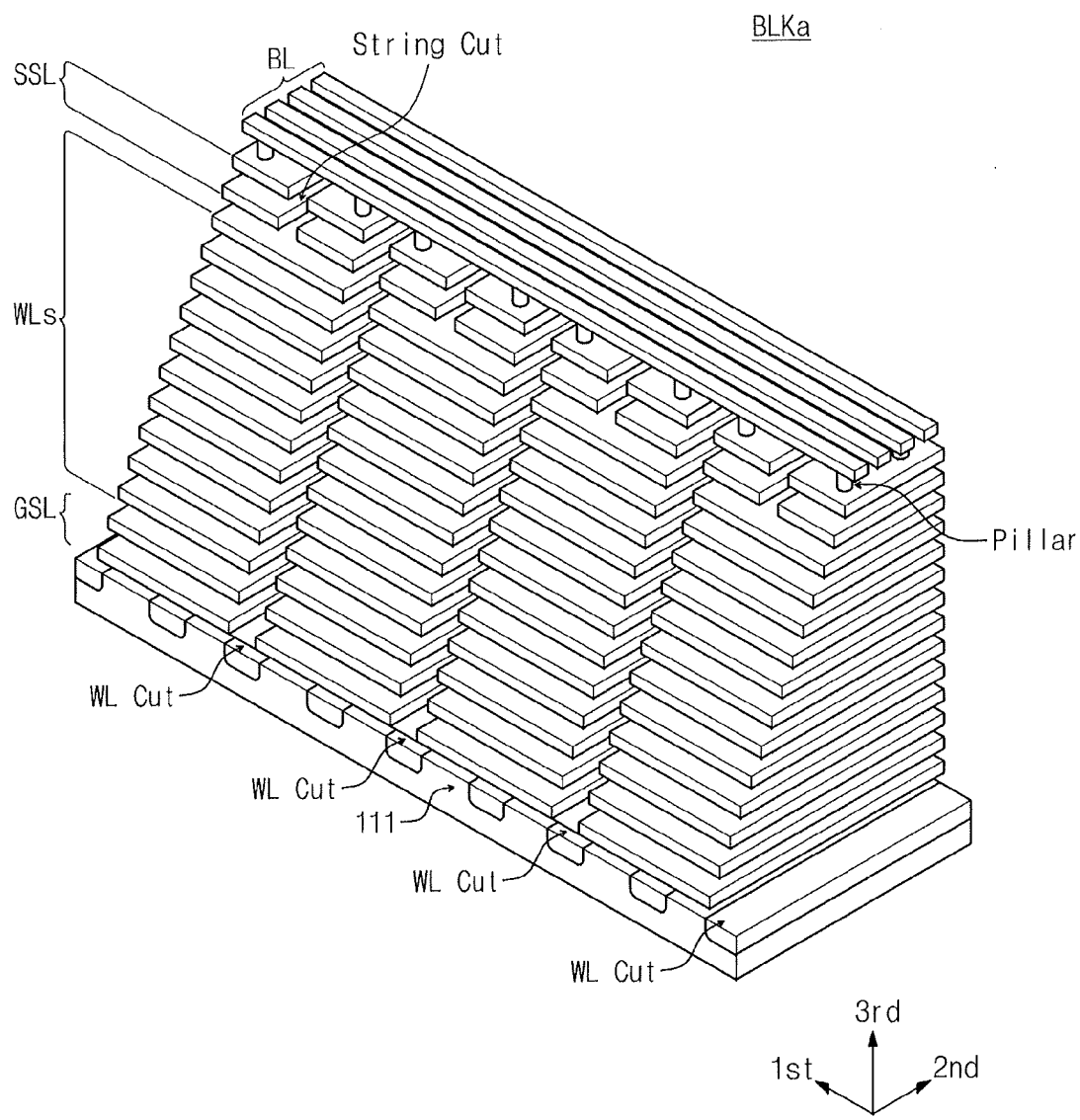
FIGS. 9A and 9B are drawings illustrating memory blocks of a three-dimensional cell array included in nonvolatile memory devices illustrated in FIG. 1.
Figure 9B:
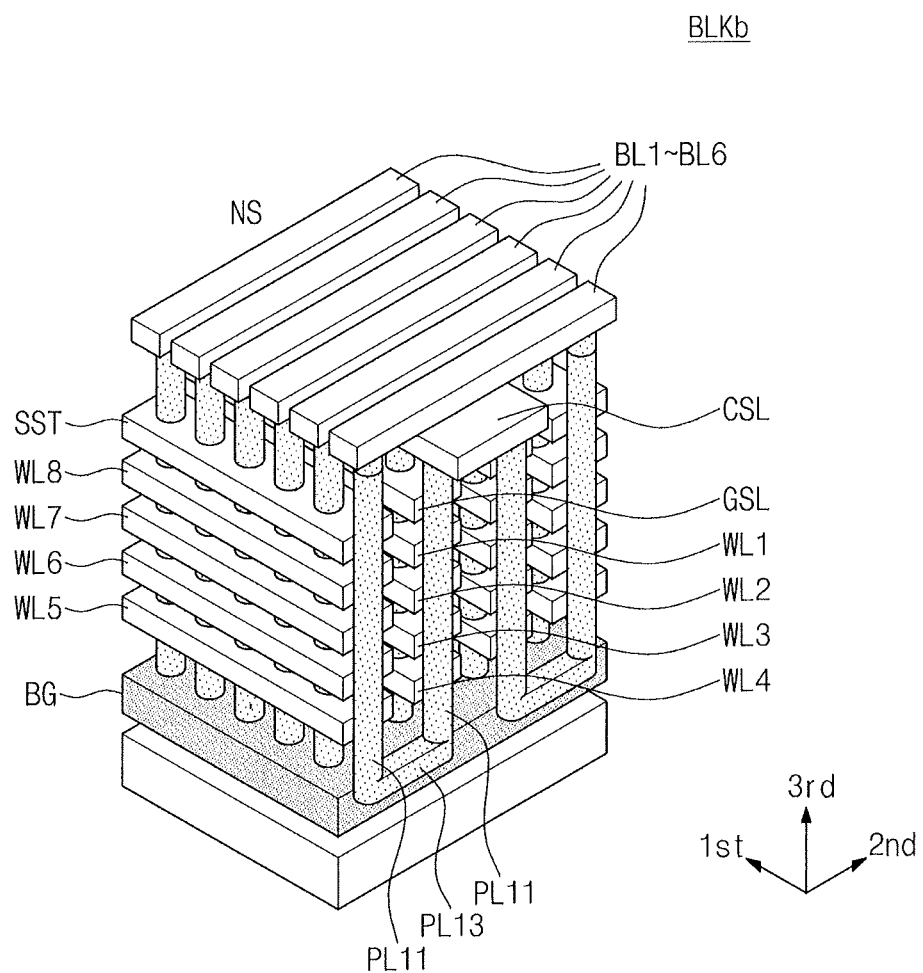

FIGS. 9A and 9B are drawings illustrating memory blocks of a three-dimensional cell array included in an Example embodiment of nonvolatile memory devices in accordance with principles of inventive concepts such as those illustrated in FIG. 1.

Referring to FIG. 9A, a memory block BLKa may include at least four sub blocks formed on a substrate. In each sub block, at least one ground select line GSL, a plurality of word lines WLs, and at least one string select line SSL are formed on a substrate between word line cuts in a plate-like, or planar, shape. The at least one string select line SSL is divided by a string select line cut. A string select line cut exists in the memory block BLKa but a memory block in accordance with principles of inventive concepts is not limited thereto. A memory block in accordance with principles of inventive concepts may be embodied not to include a string select line cut.

At least one dummy word line may be formed in a plate-like shape between the ground select line GSL and the word lines WLs or at least one dummy word line may be formed in a plate-like shape between the word lines WLs and the string select line SSL. Although not illustrated, each of word line cuts includes a CSL (common source line). In Example embodiments, the CSLs included in the word line cuts are connected in common. A pillar connected to a bit line penetrates at least ground select line GSL, a plurality of word lines WLs and at least one string select line SSL to form a string.

In FIG. 9A, an object between the word line cuts is illustrated as a sub block but inventive concepts are not limited thereto. The sub block of inventive concepts can call an object between the word line cut and the string select line cut. The block BLKa of inventive concepts may be embodied in a structure in which two word lines are merged into one, that is, a merged word line structure.

FIG. 9B is a drawing illustrating a memory block BLKb in accordance with other Example embodiments of inventive concepts. Referring to FIG. 9B, for convenience of description, it is assumed that the number of layers of word lines of the memory block BLKb is four. The memory block BLKb is embodied in a PBiCS (pipe-shaped bit cost scalable) structure in which lower portions of adjacent memory cells serially connected are connected to one another through pipes. The memory block BLKb includes strings NS of m×n (n, m are natural numbers).

In FIG. 9B, m is 6 and n is 2. Each string NS includes memory cells MC1~MC8 serially connected to one another. A first upper portion of the memory cells MC1~MC8 is connected to a string select transistor SST, a second upper portion of the memory cells MC1~MC8 is connected to a ground select transistor GST and a lower portion of the memory cells MC1~MC8 is connected through the pipe.

Memory cells constituting a string NS are stacked on a plurality of semiconductor layers to be formed. Each string NS includes a first pillar PL11, a second pillar PL12 and a pillar connection part PL13 connecting the first and second pillars PL11 and PL12. The first pillar PL11 is connected to a bit line (for example, BL1) and the pillar connection part PL13 and penetrates the string select line SSL and the word lines WL5~WL8 to be formed. The second pillar PL12 is connected to the common source line CSL and the pillar connection part PL13 and penetrates the ground select line GSL and the word lines WL1~WL4 to be formed. As illustrated in FIG. 9B, the string NS is embodied in a U character shape.

In Example embodiments, a back-gate BG may be formed on a substrate and the pillar connection part PL13 may be embodied inside the back-gate BG. The back-gate BG may exist in the memory block BLKb in common. The back-gate BG may be separated from a back-gate of other memory block.

Figure 10:
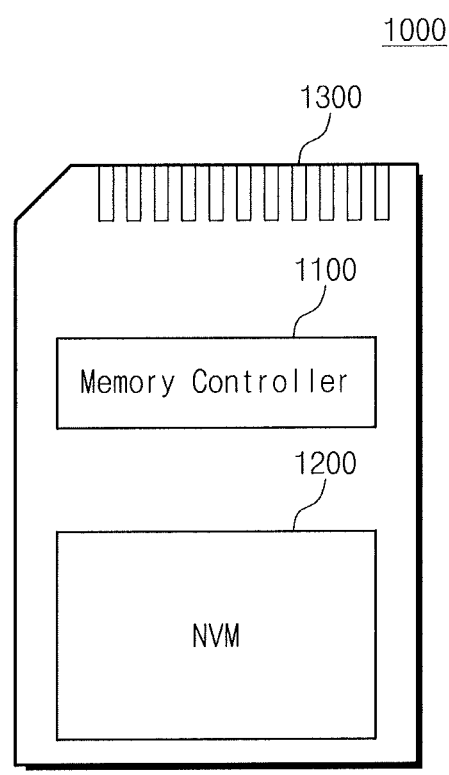
FIG. 10 is a block diagram illustrating a memory card system including a nonvolatile memory system in accordance with Example embodiments of inventive concepts.

FIG. 10 is a block diagram illustrating a memory card system including a nonvolatile memory system in accordance with Example embodiments of inventive concepts. Referring to FIG. 10, the memory card system 1000 includes a memory controller 1100, a nonvolatile memory 1200 and a connector 1300.

The memory controller 1100 is connected to the nonvolatile memory 1200. The memory controller 1100 is configured to access the nonvolatile memory 1200. For example, the memory controller 1100 is configured to control read, write, erase and background operations of the nonvolatile memory 1200. The background operation includes operations such as a wear level management, garbage collection, etc. The memory controller 1100, as described in FIG. 1, can perform a reliability operation of various levels with reference to power maintaining information being provided from an external device in accordance with principles of inventive concepts.

The memory controller 1100 is configured to provide an interface between the nonvolatile memory 1200 and an external device. The memory controller 1100 is configured to drive firmware for controlling the nonvolatile memory 1200. The memory controller 1100 may include constituent elements such as a RAM (random access memory), a processing unit, a host interface, a memory interface, an error correction part, etc.

The memory controller can communicate with an external device through the connector 1300. The memory controller 1100 can communicate with an external device (for example, a host) according to a specific communication standard. The memory controller 1100 may be configured to communicate with an external device through at least one of a USB (universal serial bus), a MMC (multimedia card), an eMMC (embedded MMC), a PCI (peripheral component interconnection), a PCI-E (PCI-express), an ATA (advanced technology attachment), a serial-ATA, a parallel-ATA, a SCSI (small computer small interface), an ESDI (enhanced small disk interface), an IDE (integrated drive electronics), a MIPI (mobile industry processor interface), a NVMe (nonvolatile memory-express), etc. A write command defined by communication standards described above may include size information of write data, for example.

The nonvolatile memory 1200 may be embodied by nonvolatile memory devices such as an EPROM (electrically erasable and programmable ROM), a NAND flash memory, a NOR flash memory, a PRAM (phase-change RAM), a ReRAM (resistive RAM), a FRAM (ferroelectric RAM), a STT-MRAM (spin-torque magnetic RAM), etc.

In Example embodiments in accordance with principles of inventive concepts, memory controller 1100 and nonvolatile memory 1200 can be integrated into one semiconductor device. The memory controller 1100 and the nonvolatile memory 1200 can be integrated into one semiconductor device to implement a SSD (solid state drive), for example. The memory controller 1100 and the nonvolatile memory 1200 can be integrated into one semiconductor device to implement a memory card. For example, the memory controller 1100 and the nonvolatile memory 1200 can be integrated into one semiconductor device to implement a memory card such as a personal computer memory card international association (PCMCIA) card, a compact flash (CF) card, a smart media card (SM, SMC), a memory stick, a multimedia card (MMC, RS-MMC, MMCmicro), a SD card (SD, miniSD, microSD, SDHC), a universal flash memory device (UFS), etc.

Figure 11:
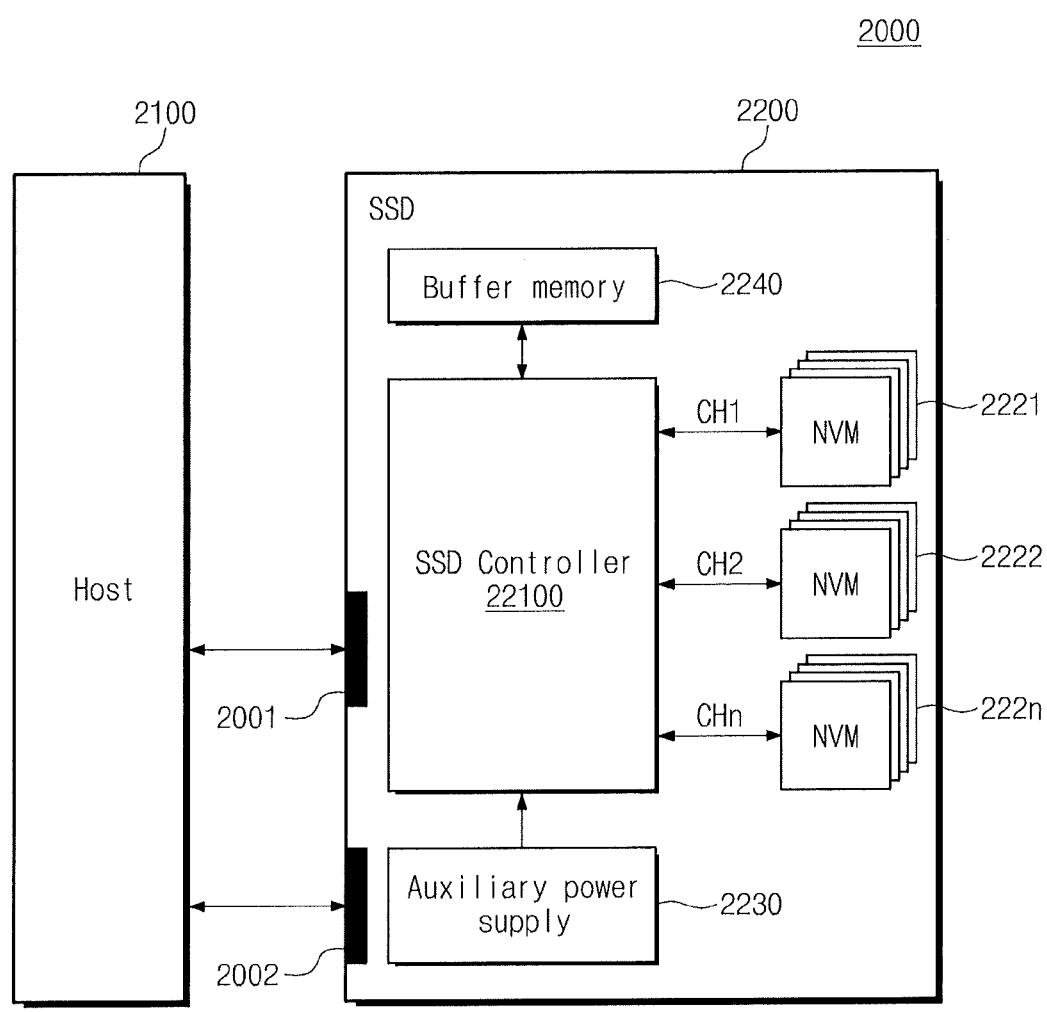
FIG. 11 is a block diagram illustrating a SSD (solid state drive) including a nonvolatile memory system in accordance with Example embodiments of inventive concepts.

FIG. 11 is a block diagram illustrating a SSD (solid state drive) including a nonvolatile memory system in accordance with Example embodiments of inventive concepts. Referring to FIG. 11, a SSD system 2000 includes a host 2100 and a SSD 2200, The SSD 2200 exchanges a signal with the host 2100 through a signal connector 2001 and is supplied with power through a power connector 2002. The SSD 2200 may include a plurality of flash memories 2221~222n, a SSD controller 2210, an auxiliary power supply 2230 and a buffer memory 2240.

The SSD controller 2210 can control the flash memories 2221~222n in response to a signal received from the host 2100. As described in FIG. 1, the SSD controller 2210 may perform a reliability operation of various levels with reference to power maintaining information being provided from the host 2100 in accordance with principles of inventive concepts.

The auxiliary power supply 2230 is connected to the host 2100 through the power connector 2002. The auxiliary power supply 2230 can receive power PWR from the host 2100 to charge it. In the case that a power supply from the host 2100 is not smooth, the auxiliary power supply 2230 may provide regulated power to the SSD system 2000. The auxiliary power supply 2230 can be located inside or outside the SSD 2200. For example, the auxiliary power supply 2230 may be located on a main board and can provide auxiliary power to the SSD 2200.

The buffer memory 2240 operates as a buffer memory of the SSD 2200. For example, the buffer memory 2240 can temporarily store data received from the host 2100, data received from the flash memories 2221~222n, or meta data (for example, a mapping table) of the flash memories 2221~222n. The buffer memory 2240 may include a volatile memory such as DRAM, SDRAM, DDR SDRAM, LPDDR SDRAM, SDRAM, etc, or a nonvolatile memory such as a FRAM, a ReRAM, a STT-RAM, a PRAM, etc.

Figure 12:
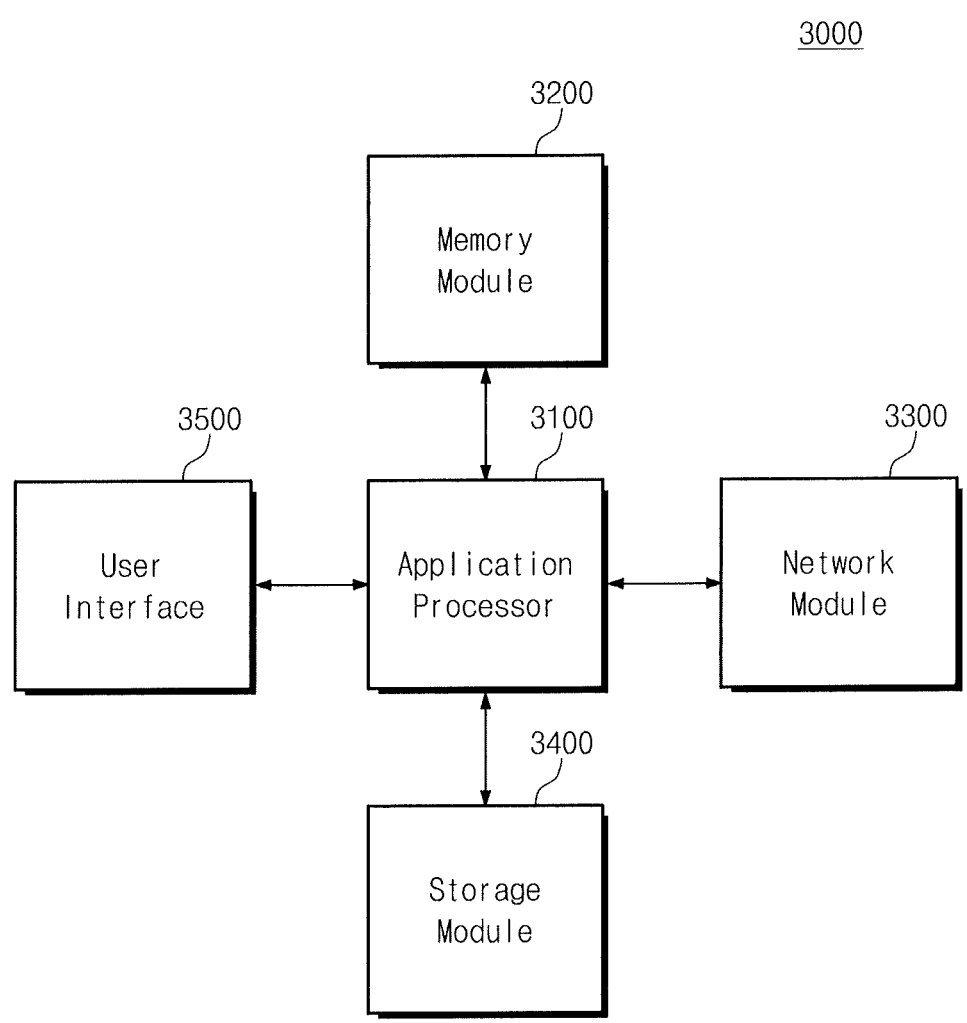
FIG. 12 is a block diagram illustrating a user system including a nonvolatile memory system in accordance with Example embodiments of inventive concepts.

FIG. 12 is a block diagram illustrating a user system including a nonvolatile memory system in accordance with Example embodiments of inventive concepts. Referring to FIG. 12, a user system 3000 includes an application processor 3100, a memory module 3200, a network module 3300, a storage module 3400 and a user interface 3500.

The application processor 3100 can drive constituent elements and an operating system OS that are included in the user system 3000. The application processor 3100 may include controllers controlling constituent elements included in the user system 3000, a graphic engine, and various interfaces. The application processor 3100 may be provided as a SoC (system on chip), for example.

The memory module 3200 can operate as a main, operation, buffer or cache memory of the user system 3000. The memory module 3200 may include a volatile random access memory such as DRAM, SDRAM, DDR SDRAM, DDR2 SDRAM, DDR3 SDRAM, LPDDR DRAM, LPDDR2 DRAM, LPDDR3 DRAM, etc. or a nonvolatile random access memory such as PRAM, ReRAM, MRAM, FRAM, etc. The memory module 3200 can be packaged with the application processor 3100 in a POP method, for example.

The network module 3300 can perform a communication with external devices. The network module 3300 can support a wireless communication such as a CDMA (code division multiple access), a GSM (global system for mobile communication), a WCDMA (wideband CDMA), a CDMA-2000, a TDMA (time division multiple access), a LTE (long term evolution), a Wimax, a WLAN, a UWB, a blue tooth, a WI-DI, etc. The network module 3300 may be included in the application processor 3100.

The storage module 3400 can store data, for example, from the application processor 3100. The storage module 3400 can transmit data stored in the storage module 3400 to the application processor 3100. The storage module 3400 can be embodied by a semiconductor memory device such as a PRAM, a MRAM, a RRAM, a NAND flash, a NOR flash, a three-dimensional NAND flash, etc.

In Example embodiments in accordance with principles of inventive concepts, storage module 3400 may operate in the same manner as the storage device 120 of FIG. 1. The storage module 3400 can communicate with the application processor 3100 based on a predetermined interface. The storage module 3400 can control performance time of a garbage collection on the basis of a write command received from the application processor 3100.

The user interface 3500 may include interfaces that input data or a command into the user system 2100 or output data to an external device. The user interface 3500 may include input devices such as such as a keyboard, a keypad, a button, a touch panel, a touch screen, a touch pad, a touch ball, a camera, a mike, a gyroscope sensor, a vibration sensor, a piezoelectric element, etc. The user interface 3500 may include user output interfaces such as a liquid crystal display (LCD), an organic light emitting diode (OLED) display, an active matrix OLED (AMOLED) display, a LED, a speaker, a motor, etc.

The nonvolatile memory device or the memory controller described above may be mounted using various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

According to Example embodiments in accordance with principles of inventive concepts, a storage device is provided which can perform a memory control operation having a high priority according to a PSI (power state information) of a host. Thus, even if a PS (power state) of a host is changed, a storage device in accordance with principles of inventive concepts can guarantee data reliability and memory performance based on that information.

The above-disclosed subject matter is to be considered illustrative, and not restrictive, and the appended claims are intended to cover all such modifications, enhancements, and other embodiments, which fall within the true spirit and scope of inventive concepts. Thus, to the maximum extent allowed by law, the scope of inventive concepts is to be determined by the broadest permissible interpretation of the following claims and their equivalents, and shall not be restricted or limited by the foregoing detailed description.

What is claimed is:

1. A method of operating a storage device including a nonvolatile memory device comprising:
   receiving power state information representing a state of power being supplied from a host to the storage device;
   determining a power state of the storage device according to a change of the power state information;
   selecting at least one of a plurality of reliability levels with respect to the nonvolatile memory device according to the determined power state; and
   performing a reliability guarantee operation with respect to the nonvolatile memory device corresponding to the selected at least one reliability level,
   wherein the power state is one of three predictability states, including unpredictable state, sustainable state, and off-expected state with respect to the power supply.

2. The method of operating the storage device of claim 1, wherein after power is first supplied, the power state is initialized to the unpredictable state.

3. The method of operating the storage device of claim 1, wherein the reliability level comprises at least three levels, including a best-effort, a not-guaranteed and a confirmed.

4. The method of operating the storage device of claim 3, wherein when the reliability level is determined as best-effort, a backup operation with respect to data being written in the nonvolatile memory device or a backup operation with respect to meta data of the data being written in the nonvolatile memory device is repeatedly performed within a first period.

5. The method of operating the storage device of claim 4, wherein when the reliability level is determined as the not-guaranteed, a backup operation with respect to data being written in the nonvolatile memory device or a backup operation with respect to meta data of the data being written in the nonvolatile memory device is repeatedly performed within a second period longer than the first period.

6. The method of operating the storage device of claim 4, wherein in the case that the reliability level is determined as the not-guaranteed, any one of a backup operation with respect to data being written in the nonvolatile memory device and a backup operation with respect to meta data of the data being written in the nonvolatile memory device is selectively performed.

7. The method of operating the storage device of claim 4, wherein when the reliability level is determined as not-guaranteed, at least one of an erase count, cell characteristic information and program order information with respect to a selected memory block of the nonvolatile memory device is periodically backed up.

8. The method of operating the storage device of claim 3, wherein when the reliability level is determined as confirmed, a backup operation with respect to data being written in the nonvolatile memory device and a backup operation with respect to meta data of the data being written in the nonvolatile memory device is performed once.

9. The method of operating the storage device of claim 3, wherein a reliability level of best-effort is determined in a power state corresponding to unpredictable, a reliability level of not-guaranteed is determined in a power state corresponding to sustainable and a reliability level of the confirmed is determined in a power state corresponding to off-expected.

10. The method of operating the storage device of claim 1, wherein if a write command is provided from the host in a power state corresponding to off-expected, the power state transitions to unpredictable.

11. The method of operating the storage device of claim 1, wherein the nonvolatile memory device comprises a three-dimensional memory array including a charge trap layer.

12. A storage device comprising:
   a nonvolatile memory device; and
   a memory controller configured to control the nonvolatile memory device according to a request from a host, wherein the memory controller receives state information with respect to a power supply provided from the host to determine a reliability level with respect to an access operation of the nonvolatile memory device and performs a reliability guarantee operation corresponding to the determined reliability level, and wherein the state information with respect to a power supply comprises at least one of three predictability levels including: unpredictable, sustainable, and off-expected.

13. The storage device of claim 12, wherein when the state information corresponds to the unpredictable, the memory controller is configured to perform a reliability guarantee operation corresponding to a highest level among the reliability levels.

14. The storage device of claim 12, wherein when the state information is sustainable, the memory controller is configured to perform a reliability guarantee operation corresponding to a lowest level among the reliability levels and at least one of an erase count, cell characteristic information and program order information with respect to a selected memory block of the nonvolatile memory device is periodically backed up.

15. The storage device of claim 12, wherein when the state information corresponds to the off-expected, the memory controller is configured to perform a backup with respect to data being written in a selected memory block of the nonvolatile memory data being written in a selected memory block of the nonvolatile memory device once.

16. A storage device comprising:
a nonvolatile memory device; and
a memory controller configured to control the nonvolatile memory device in response to a request from a host,
wherein the memory controller is configured to employ state information related to the confidence level of a power supply to determine a reliability level with respect to an access operation of the nonvolatile memory device and to perform a reliability guarantee operation corresponding to the determined reliability level.

17. The storage device of claim 16, wherein the memory controller is configured to set a backup period corresponding to a reliability level as a part of a reliability guarantee operation.

18. The storage device of claim 17, wherein the memory controller is configured to set a backup period for data.

19. The storage device of claim 17, wherein the memory controller is configured to set a backup period for meta-data.

20. The storage device of claim 17, wherein the memory controller is configured to set a relatively long backup period corresponding to a high level of confidence in the availability of the power supply.

* * * * *